(12) United States Patent
Lv et al.

(10) Patent No.: US 11,922,885 B2
(45) Date of Patent: Mar. 5, 2024

(54) DISPLAY PANEL AND DISPLAY DRIVING METHOD FOR DISPLAY PANEL AND DISPLAY APPARATUS

(71) Applicant: Xiamen Tianma Display Technology Co., Ltd., Xiamen (CN)

(72) Inventors: Shimeng Lv, Xiamen (CN); Jingxiong Zhou, Xiamen (CN); Wang Yu, Xiamen (CN); Zuoyang Wu, Xiamen (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 17/954,361

(22) Filed: Sep. 28, 2022

(65) Prior Publication Data
US 2024/0005870 A1  Jan. 4, 2024

(30) Foreign Application Priority Data
Jun. 30, 2022 (CN) .......................... 202210760196.9

(51) Int. Cl.
*G09G 3/3266* (2016.01)
*G09G 3/3233* (2016.01)
*G11C 19/28* (2006.01)

(52) U.S. Cl.
CPC ......... *G09G 3/3266* (2013.01); *G09G 3/3233* (2013.01); *G11C 19/28* (2013.01); *G09G 2300/0842* (2013.01); *G09G 2310/0286* (2013.01); *G09G 2320/0233* (2013.01); *G09G 2320/0247* (2013.01); *G09G 2330/021* (2013.01)

(58) Field of Classification Search
None
See application file for complete search history.

(56) References Cited

U.S. PATENT DOCUMENTS

| | | | | |
|---|---|---|---|---|
| 2004/0001054 A1* | 1/2004 | Nitta | .................... | G09G 3/3648 345/204 |
| 2004/0125046 A1* | 7/2004 | Yamazaki | ................ | G09G 3/20 345/1.3 |
| 2019/0114955 A1* | 4/2019 | Yamamoto | ........... | G09G 3/2085 |
| 2019/0147818 A1* | 5/2019 | Wang | .................... | G09G 3/3674 345/204 |
| 2021/0272505 A1* | 9/2021 | Kim | ........................ | G09G 3/36 |
| 2023/0098172 A1* | 3/2023 | Tamura | ................ | G09G 3/3233 345/214 |

FOREIGN PATENT DOCUMENTS

| | | |
|---|---|---|
| CN | 102760406 A | 10/2012 |
| CN | 104157236 A | 11/2014 |

* cited by examiner

*Primary Examiner* — Dorothy Harris
(74) *Attorney, Agent, or Firm* — East IP P.C.

(57) ABSTRACT

The present application discloses a display panel, a display driving method for display panel, and a display apparatus. The display panel includes a plurality of rows of pixel circuits; a gate drive circuit configured to be switched between a first drive mode and a second drive mode, wherein the first drive mode comprises that the gate drive circuit provides gate signals to n rows of the pixel circuits simultaneously, and the second drive mode comprises that the gate drive circuit provides gate signals to m*n rows of the pixel circuits simultaneously, wherein n is a positive integer, and m is an integer greater than or equal to 2.

10 Claims, 14 Drawing Sheets

US 11,922,885 B2

DISPLAY PANEL AND DISPLAY DRIVING METHOD FOR DISPLAY PANEL AND DISPLAY APPARATUS

CROSS REFERENCE TO RELATED APPLICATION

This application claims priority to Chinese Patent Application No. 202210760196.9, filed on Jun. 30, 2022, which is hereby incorporated by reference in its entirety.

TECHNICAL FIELD

The present application relates to a field of display technology, and particularly to a display panel and a display driving method for display panel and a display apparatus.

BACKGROUND

The organic light emitting diode (OLED) display panel has many advantages such as self-luminescence, fast response, high brightness, lightness and thinness, and has gradually become the mainstream in the display field. A gate drive circuit needs to be provided in the OLED display panel, and the gate signals generated by the gate drive circuit may control the pixel circuits to turn into a light-emitting stage and drive light-emitting elements to emit light.

However, the design of the gate drive circuit of the display panel in the related art cannot meet the diversified demands.

SUMMARY

Embodiments of the present application provide a display panel, a display driving method for display panel and a display apparatus.

In a first aspect, an embodiment of the present application provides a display panel including a plurality of rows of pixel circuits; a gate drive circuit configured to be switched between a first drive mode and a second drive mode, wherein the first drive mode includes that the gate drive circuit provides gate signals to n rows of the pixel circuits simultaneously, and the second drive mode includes that the gate drive circuit provides gate signals to m*n rows of the pixel circuits simultaneously, wherein n is a positive integer, and m is an integer greater than or equal to 2.

Based on the same inventive concept, in a second aspect, an embodiment of the present application provides a display driving method for display panel, the display driving method is to drive the display panel according to the embodiment of the first aspect, and the display driving method includes: obtaining a current usage scenario; selecting a drive mode corresponding to the current usage scenario from the first drive mode and the second drive mode; and controlling the gate drive circuit to operate in the selected drive mode.

Based on the same inventive concept, in a third aspect, an embodiment of the present application provides a display apparatus including the display panel according to the embodiment of the first aspect.

BRIEF DESCRIPTION OF THE DRAWINGS

Other features, objects and advantages of the present application will become more apparent upon reading the following detailed description of non-limiting embodiments with reference to the accompanying drawings, in which the same or similar reference numerals denote the same or similar features, and the figures are not drawn to actual scale.

DETAILED DESCRIPTION

Figure 1:
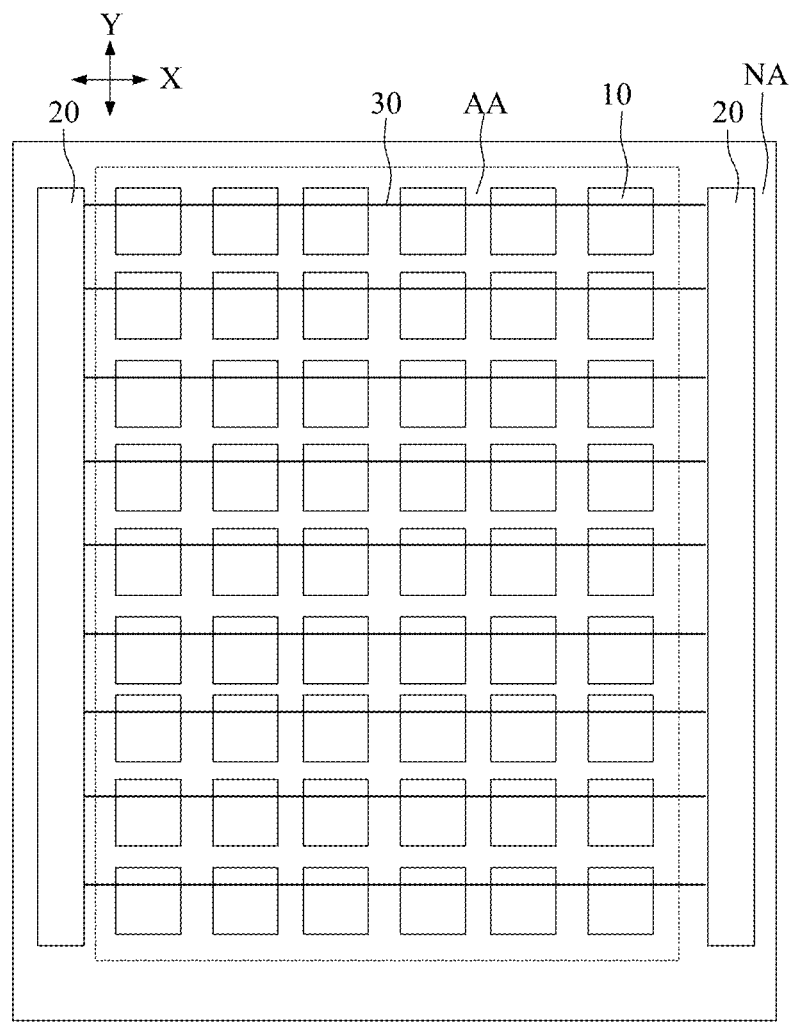
FIG. 1 shows a schematic top view of a display panel provided by an embodiment of the present application.

The features and exemplary embodiments of various aspects of the present application will be described in detail below. In order to make the purpose, technical solutions and advantages of the present application more clear, the present application will be further described in detail below with reference to the accompanying drawings and specific embodiments. It should be understood that the specific embodiments described herein are only configured to explain the present application, and are not configured to limit the present application. It will be apparent to those skilled in the art that the present application may be practiced without some of these specific details. The following description of the embodiments is merely to provide a better understanding of the present application by illustrating examples of the present application.

It should be noted that, relational terms such as first and second herein are used only to distinguish one entity or operation from another entity or operation, and do not necessarily require or imply that any such relationship or sequence actually exists among these entities or operations. In addition, the terms "include", "comprise" or any other variation thereof are intended to encompass non-exclusive inclusion such that a process, method, article or device which includes a list of elements includes not only those elements, but also other elements which are not explicitly listed or elements inherent to such process, method, article or device. Without further limitation, an element defined by the phrase "include" does not preclude the presence of additional identical elements in the process, method, article, or device that includes the element.

It will be understood that, in describing a structure of a component, when a layer or region is referred to as being "on" or "over" another layer or region, it may refer to that the layer or region is directly on the another layer or region, or other layers or regions are further included between the layer or region and the another layer or region. Further, if the component is turned over, the layer or region will be "below" or "beneath" the another layer or region.

It should be understood that the term "and/or" used in this document is only an association relationship to describe the associated objects, which indicates that there may be three kinds of relationships. For example, A and/or B may indicate three cases of A existing alone, A and B existing at the same time, and B existing alone. In addition, the character "/" herein generally indicates that the related objects have an "or" relationship.

In the embodiments of the present application, the term "connection" may refer to the direct connection of two components, or may refer to the connection between the two components via one or more other components.

It will be apparent to those skilled in the art that various modifications and variations may be made in this application without departing from the spirit or scope of the application. Accordingly, this application is intended to cover the modifications and variations of this application that fall within the scope of the corresponding claims (claimed technical solutions) and their equivalents. It should be noted that the implementations provided in the embodiments of the present application may be combined with each other if there is no confliction.

Before explaining the technical solutions provided by the embodiments of the present application, in order to facilitate the understanding of the embodiments of the present application, the problems existed in the related art will be specifically described in the present application.

The inventor found through research that the gate drive circuit of the display panel in the related art has single driving manner. For an example, a gate drive circuit employs a one-drive-two design, that is, the gate drive circuit may provide gate signals to two rows of pixel circuits simultaneously. For another example, a gate drive circuit employs a one-drive-one design, that is, the gate drive circuit may provide gate signals to a row of pixel circuits. For the gate drive circuit which employs the one-drive-two design method, the display quality may not meet the requirement, for example, it may not meet a performance index of $\Delta L/L$ (brightness jump, $\Delta L/L$ may be equal to a ratio of a brightness difference between the adjacent shifts of the brightness bar and a brightness of a previous shift); for the gate drive circuit which employs a one-drive-one design method, there is a problem of high power consumption. Further, once the design method is determined, the layout of the corresponding display panel will be finalized, and the design of the gate drive circuit cannot be changed, and thus only one of the gate drive circuit design methods can be selected, which results in poor compatibility and adaptability allocation, inability to reduce and distribute costs.

In view of the above research findings of the inventors, embodiments of the present application provide a display panel, a display driving method for display panel, and a display apparatus. Embodiments of the display panel, the display driving method for display panel, and the display apparatus will be described below with reference to the accompanying drawings.

The display panel provided by the embodiment of the present application is first introduced below.

As shown in FIG. 1, the display panel 100 provided by the embodiment of the present application may include pixel circuits 10 and gate drive circuits 20. The display panel 100 may include a display area AA and a non-display area NA. The pixel circuits 10 may be arranged in a plurality of rows in the display area AA. Each row may include a plurality of pixel circuits 10. For example, a plurality of pixel circuits 10 may be arranged in an array in the row direction X and the column direction Y. The gate drive circuits 20 may be located in the non-display area NA.

Exemplarily, the display area AA of the display panel 100 may further be provided with light-emitting control lines 30 connected to the pixel circuits 10, and the gate drive circuits may be connected to the pixel circuits 10 via the light-emitting control lines 30. The gate signals generated by the gate drive circuits 20 may be transmitted to the pixel circuits 10 through the light emission control lines 30. When the gate signals generated by the gate drive circuit 20 are at a turn-on level, the pixel circuits 10 may be turned into the light-emitting stage, and the light-emitting elements may emit light.

At least one terminal of a light emission control line 30 may be connected to a gate drive circuit 20. For example, both terminals of a light-emitting control line 30 may be connected to the gate drive circuits 20, so as to realize bilateral driving.

Figure 2:
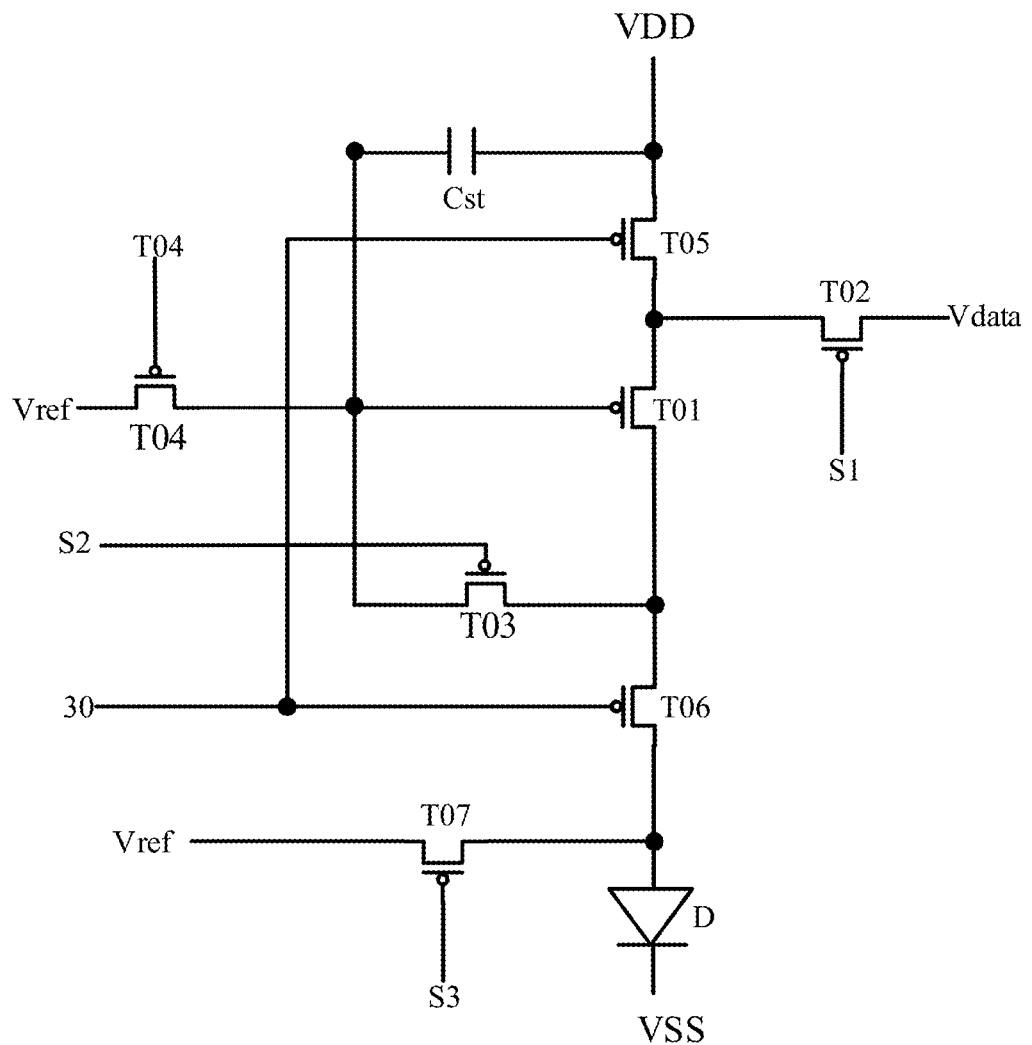
FIG. 2 shows a schematic structure diagram of a pixel circuit in a display panel provided by an embodiment of the present application.

For a better understanding of the present application, a specific example of a pixel circuit is given below. As shown in FIG. 2, the pixel circuit may include transistors T01 to T07, a storage capacitor Cst, and a light-emitting element D. In FIG. 2, VDD represents a first power supply line, VSS represents a second power supply line, Vdata represents a data line, and S1, S2, and S3 represent scan lines. The gate signal transmitted through the light-emitting control line 30 may control the turn-on or turn-off of the transistors T05 and T06. When the gate signal transmitted through the light-emitting control line 30 is at the turn-on level, the transistors T05 and T06 are turned on, and the drive transistor T01 generates a drive current which is transmitted to the light-emitting element D, and then the light-emitting element D emits light.

It should be noted that the specific structure of the pixel circuit is not limited in the present application, and the pixel circuit may also have other structures.

The gate drive circuit 20 in the display panel provided by the embodiments of the present application may support various drive modes. For example, it may support a first drive mode and a second drive mode, and may be configured to be switched between the first drive mode and the second drive mode. The first drive mode may include that the gate drive circuit 20 may provide gate signals to n rows of the pixel circuits 10 simultaneously. The second drive mode may include that the gate drive circuit 20 may provide gate signals to m*n rows of the pixel circuits 10 simultaneously. The n is a positive integer, and m is an integer greater than or equal to 2.

According to the display panel provided by the embodiments of the present application, the gate drive circuit in the display panel may be switched between the first drive mode and the second drive mode, and thus different drive modes may be selected with respect to different application scenarios. For example, in a case that a high display image quality is required, the gate drive circuit may be switched to the first drive mode to improve the display image quality and to meet the performance index of ΔL/L; in a case that a low power consumption is required, the gate drive circuit may be switched to the second drive mode to reduce power consumption. It can be seen that the display panel provided by the embodiments of the present application may improve compatibility and adaptability, and reduce and distribute costs, thereby taking into account various and diversified demands such as cost, performance, and power consumption.

Figure 3:
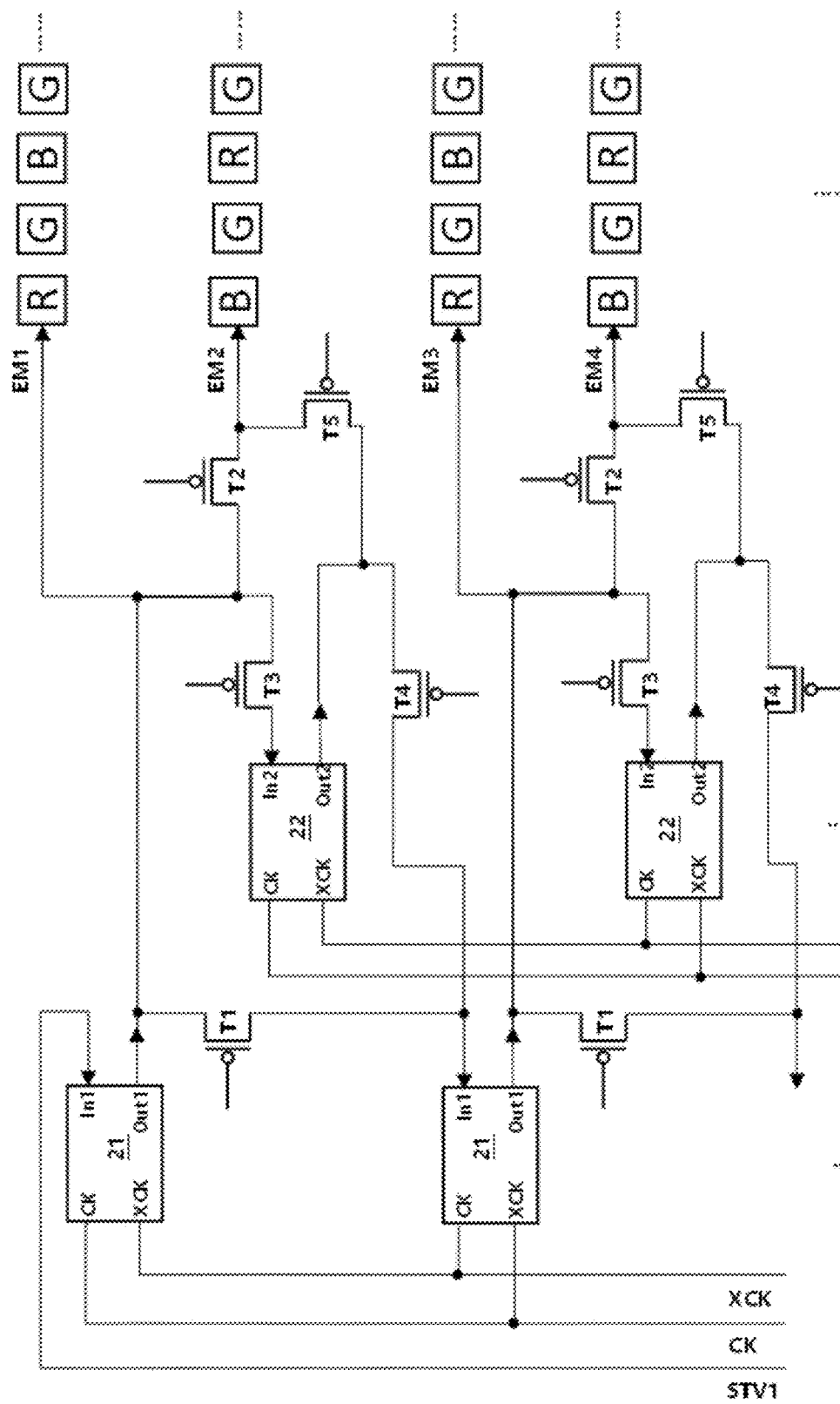
FIG. 3 shows a schematic structure diagram of a gate drive circuit in a display panel provided by an embodiment of the present application.
Figure 4:
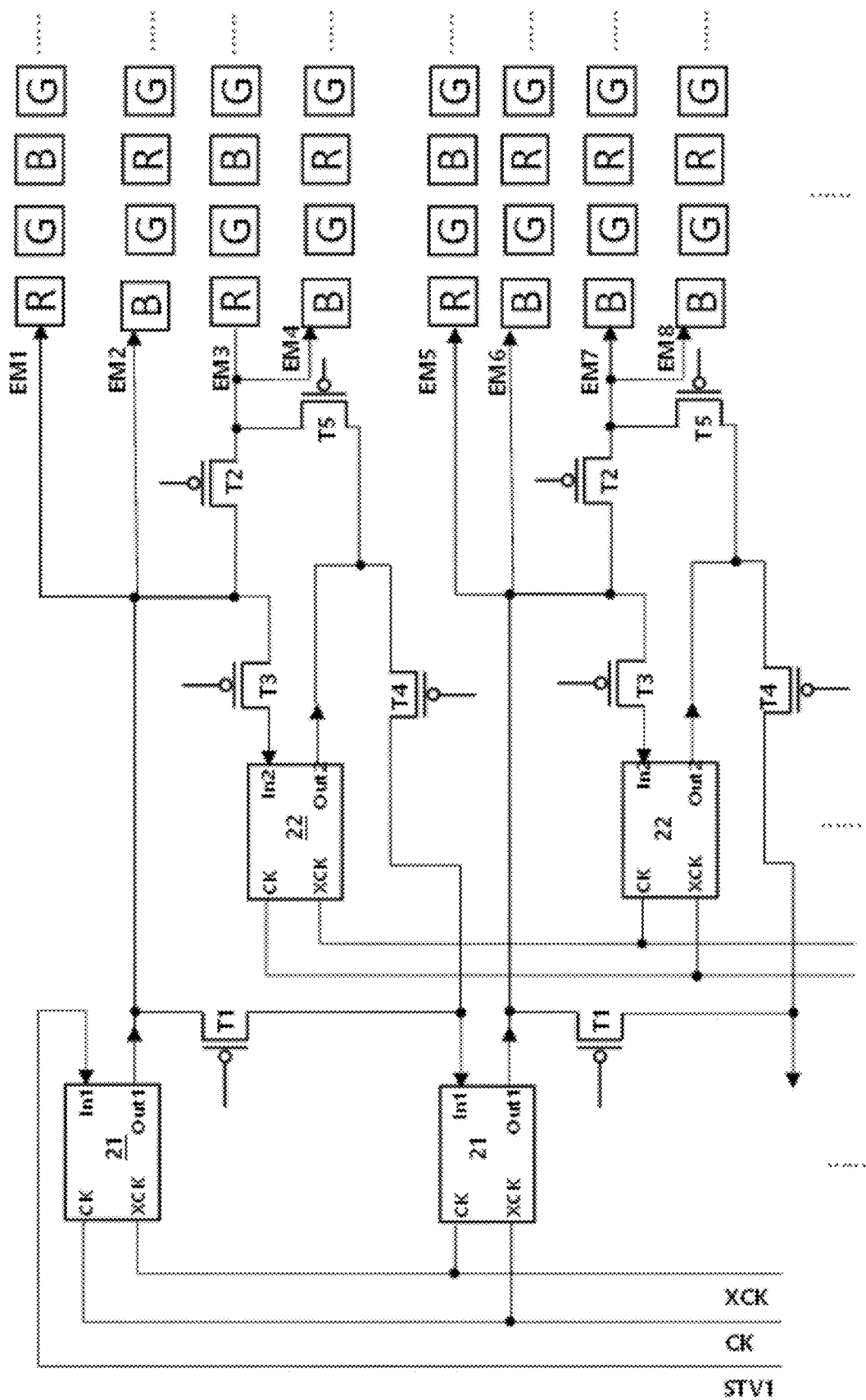
FIG. 4 shows a schematic structural diagram of a gate drive circuit in a display panel provided by another embodiment of the present application.

As an example, as shown in FIG. 3 or FIG. 4, m may be 2, and the gate drive circuit 20 may include a plurality of stages of first shift register units 21 and a plurality of stages of second shift register units 22.

Each of the first shift register units 21 may include a first start signal input terminal In1 and a first output terminal Out1, and each of the second shift register units 22 may include a second start signal input terminal In2 and a second output terminal Out2.

A first output terminal Out1 of a first shift register unit 21 of a $i^{th}$ stage is electrically connected to a first start signal input terminal In1 of a first shift register unit 21 of a (i+1)th stage via a first switch T1, and the first output terminal Out1 of the first shift register unit of the stage is directly electrically connected to $(2*i*n-2*n+1)^{th}$ to $(2*i*n-n)^{th}$ rows of the pixel circuits 10 via connecting lines, and the first output terminal of the first shift register unit 21 of the $i^{th}$ stage is electrically connected to $(2*i*n-n+1)^{th}$ to $(2*i*n)^{th}$ rows of the pixel circuits via a second switch T2.

The first output terminal Out1 of the first shift register unit 21 of the $i^{th}$ stage is electrically connected to a second start signal input terminal In2 of a second shift register unit 22 of a $i^{th}$ stage via a third switch T3.

A second output terminal Out2 of the second shift register unit 22 of the $i^{th}$ stage is electrically connected to the first start signal input terminal In1 of the first shift register unit 21 of the $(i+1)^{th}$ stage via a fourth switch T4.

The second output terminal Out2 of the second shift register unit 22 of the $i^{th}$ stage is electrically connected to $(2*i*n-n+1)^{th}$ to $(2*i*n)^{th}$ rows of the pixel circuits 10 via a fifth switch T5.

The i is a positive integer.

In FIG. 3, it is given that n=1 and m=2 as an example, and in FIG. 4, it is given that n=2 and m=2 as an example, which are not intended to limit the present application.

For an example, taking FIG. 3 as an example, in the case of n=1 and m=2, the first output terminal Out1 of the first shift register unit of the $i^{th}$ stage is directly electrically connected to the $(2*i-1)^{th}$ row of the pixel circuits 10 via the connecting lines, the first output terminal of the first shift register unit 21 of the $i^{th}$ stage is electrically connected to the $(2*i)^{th}$ row of the pixel circuits via the second switch T2, and the second output terminal Out2 of the second shift register unit 22 of the $i^{th}$ stage is electrically connected to the $(2*i)^{th}$ row of the pixel circuits 10 via a fifth switch T5.

For another example, taking FIG. 4 as an example, in the case of n=2, m=2, the first output terminal Out1 of the first shift register unit of the $i^{th}$ stage is directly electrically connected to the $(4*i-3)^{th}$ to $(4*i-2)^{th}$ rows of the pixel circuits 10 via the connecting lines, the first output terminal of the first shift register unit 21 of the $i^{th}$ stage is electrically connected to the $(4*i-1)^{th}$ to $(4*i)^{th}$ rows of the pixel circuits via the second switch T2. The second output terminal Out2 of the second shift register unit 22 of the stage is electrically connected to the $(4*i-1)^{th}$ to $(4*i)^{th}$ rows of the pixel circuits 10 via a fifth switch T5.

Further, for the clarity of the drawings, FIG. 3 illustrates only four rows of pixel circuits, and FIG. 4 illustrates only eight rows of pixel circuits. For example, a pixel circuit may include a pixel circuit of an R sub-pixel, a pixel circuit of a G sub-pixel, and a pixel circuit of a B sub-pixel. The arrangement of the sub-pixels of respective colors in FIG. 3 and FIG. 4 is only exemplary, and is not intended to limit the present application. In addition, EM1 to EM4 in FIG. 3 represent gate signals received by the first to fourth rows of the pixel circuits, and EM1 to EM8 in FIG. 4 represent gate signals received by first to eighth rows of the pixel circuits.

The first switch T1, the second switch T2, the third switch T3, the fourth switch T4 and the fifth switch T5 may include transistors. Exemplarily, the first switch T1, the second switch T2, the third switch T3, the fourth switch T4 and the fifth switch T5 may include P-type transistors. For a P-type transistor, its turn-on level is a low level, and its turn-off level is a high level.

Exemplarily, as shown in FIG. 3 or FIG. 4, a first start signal input terminal In1 of a first shift register unit 21 of a $1^{st}$ stage is electrically connected to a first start signal terminal STV1. The first shift register units 21 and the second shift register units 22 may be connected to the same clock signal terminal. For example, each of the first shift register units 21 and the second shift register units 22 may be connected to the clock signal terminals CK and XCK. By setting the first shift register units 21 and the second shift register units 22 to be connected to the same clock signal terminal, the number of clock signal terminals may be reduced and the cost may be reduced.

The clock signal terminals shown in FIG. 3 and FIG. 4 are only some examples, and are not intended to limit the present application.

Figure 5:
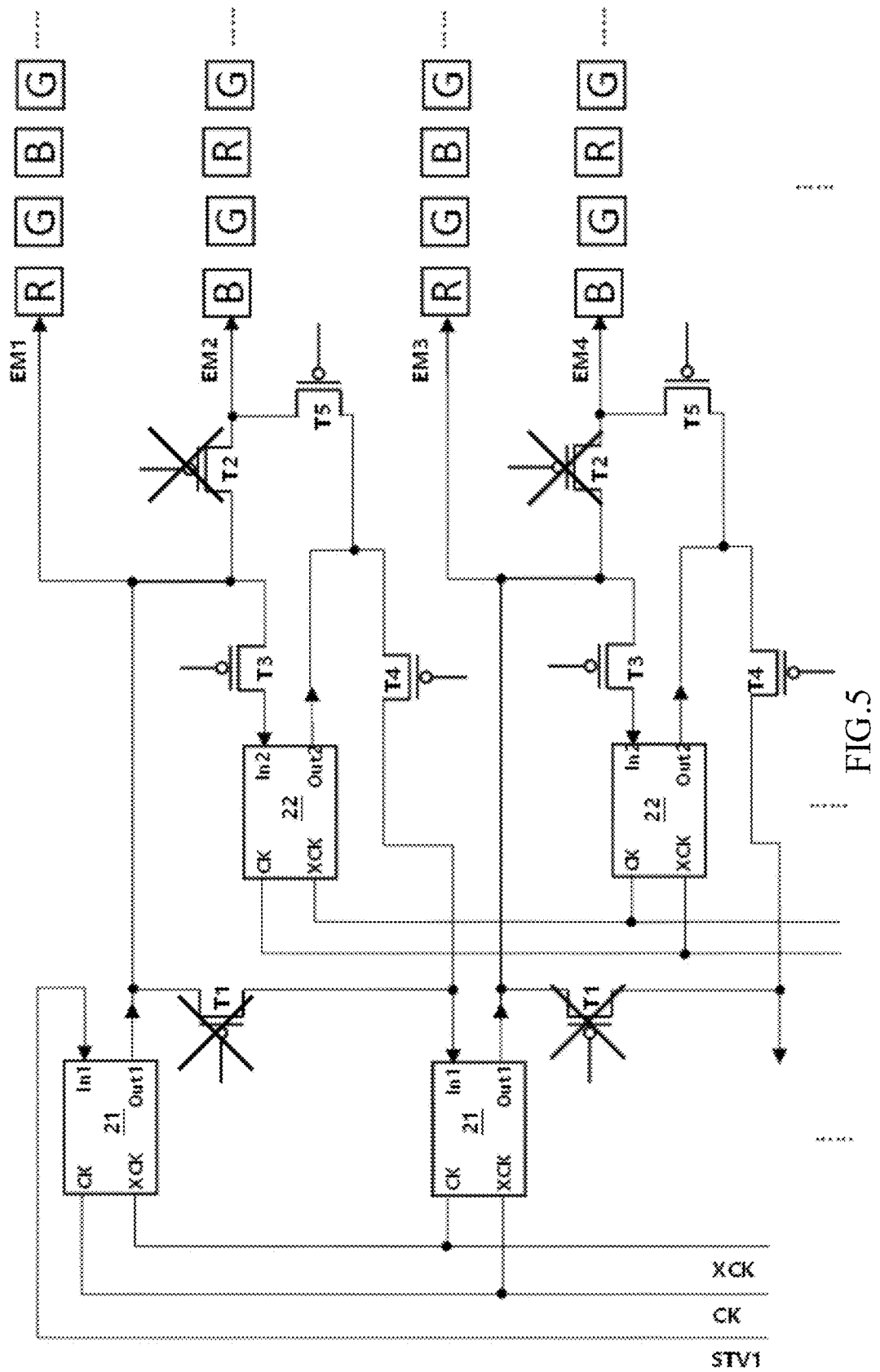
FIG. 5 shows a schematic diagram of an operating process of a gate drive circuit in a display panel provided by an embodiment of the present application.

As an example, taking n=1 and m=2 as an example, as shown in FIG. 5, in the first drive mode, the first switch T1 and the second switch T2 may be controlled to be turned off, and the third switch T3, the fourth switch T4 and the fifth switch T5 may be controlled to be turned on. The gate signals generated by the first output terminals Out1 of respective first shift register units 21 may be transmitted to the respective odd rows of the pixel circuits, and the gate signals generated by the second output terminals Out2 of respective second shift register units 22 may be transmitted to the respective even rows of the pixel circuits.

Figure 6:
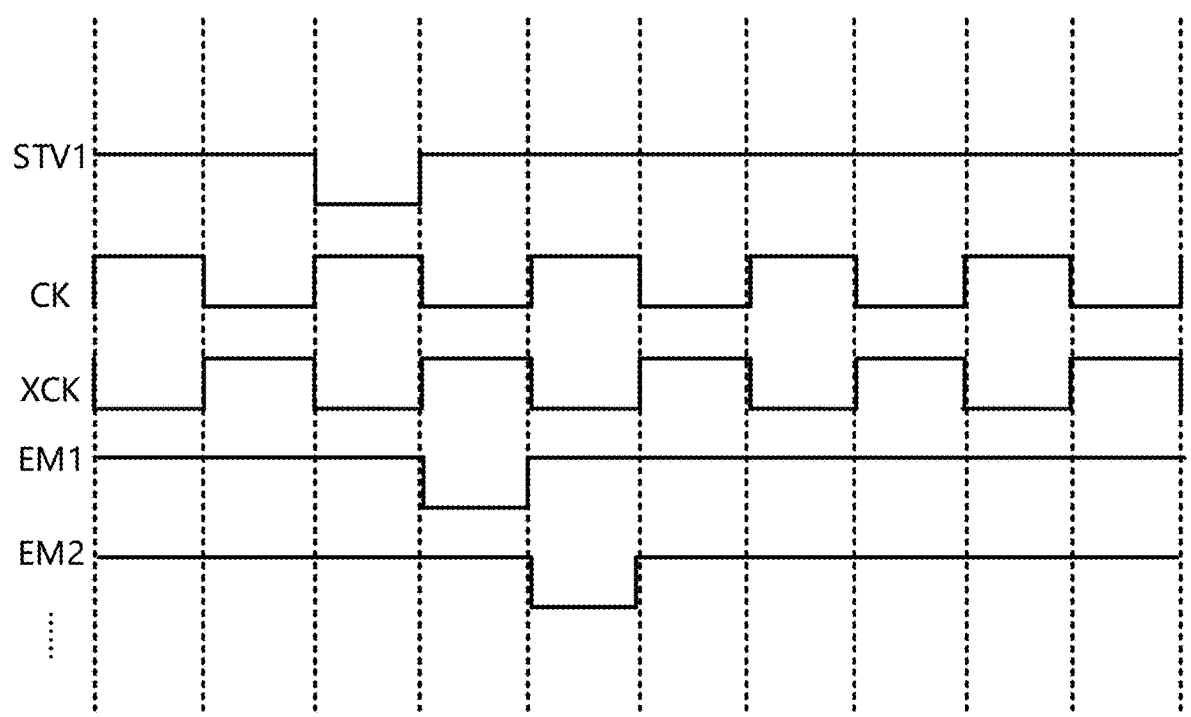
FIG. 6 shows a schematic timing diagram of a gate drive circuit in a display panel provided by an embodiment of the present application.

As shown in FIG. 6, in one frame, the gate signals EM1 to EM4 received by the first to fourth rows of the pixel circuits may be different. For example, the gate signals EM1 to EM4 received by the first to fourth rows of the pixel circuits may be signals transmitted step by step, and first to fourth rows of the pixel circuits turn into the light-emitting stage successively.

Figure 7:
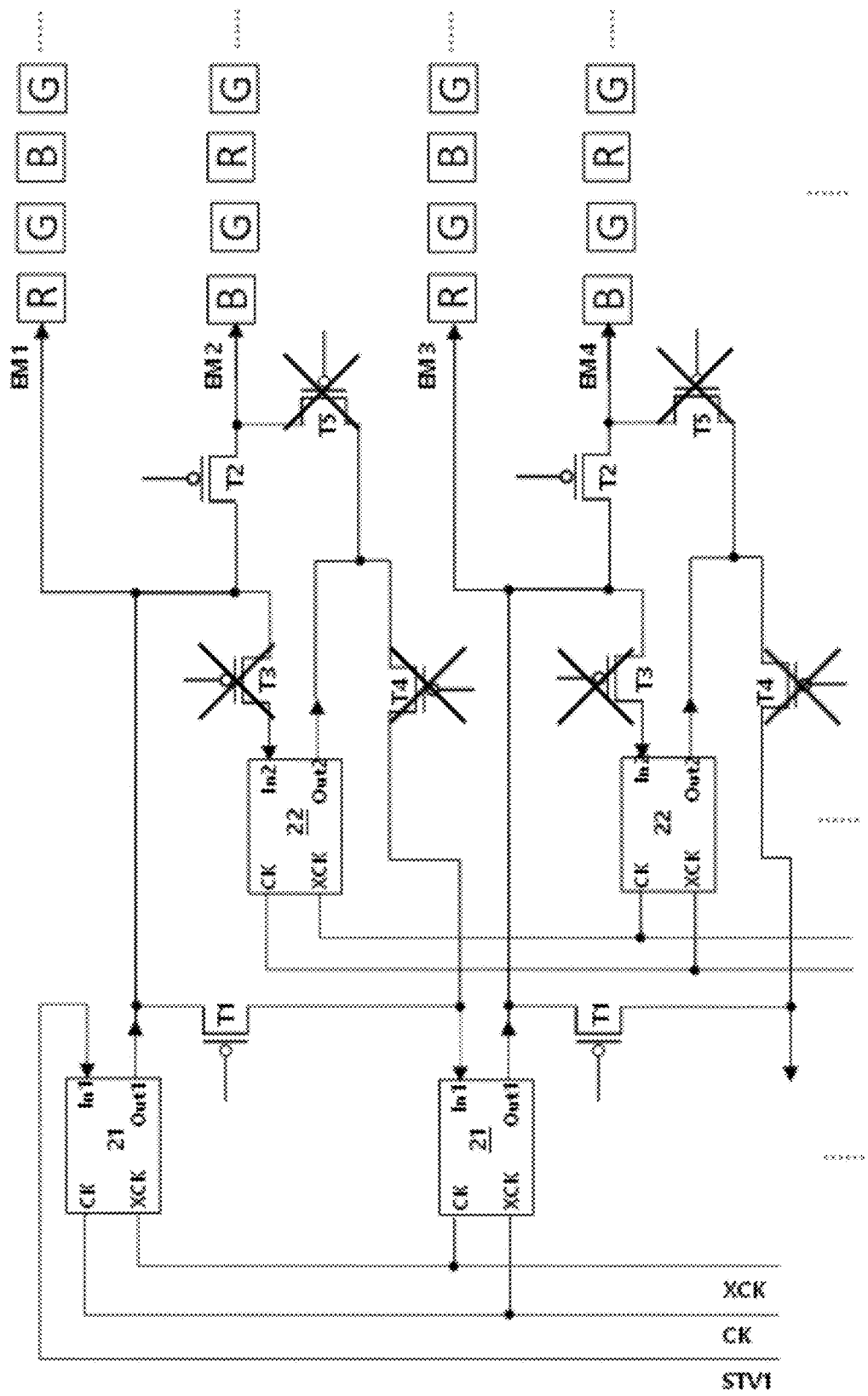
FIG. 7 shows a schematic diagram of an operating process of a gate drive circuit in a display panel provided by another embodiment of the present application.

As another example, still taking n=1 and m=2 as an example, as shown in FIG. 7, in the second drive mode, the first switch T1 and the second switch T2 may be controlled to be turned on, and the third switch T3, the fourth switch T4 and the fifth switch T5 may be controlled to be turned off. The gate signal generated by the first output terminal Out1 of each first shift register unit 21 may be transmitted to two rows of pixel circuits. The second start signal input terminal In2 of each second shift register unit 22 cannot receive the start signal, since the third switch T3 is turned off. Even if the second output terminal Out2 of each second shift register unit 22 has a signal output, the signal will not be transmitted to the pixel circuits, since the fifth switch T5 is turned off.

Figure 8:
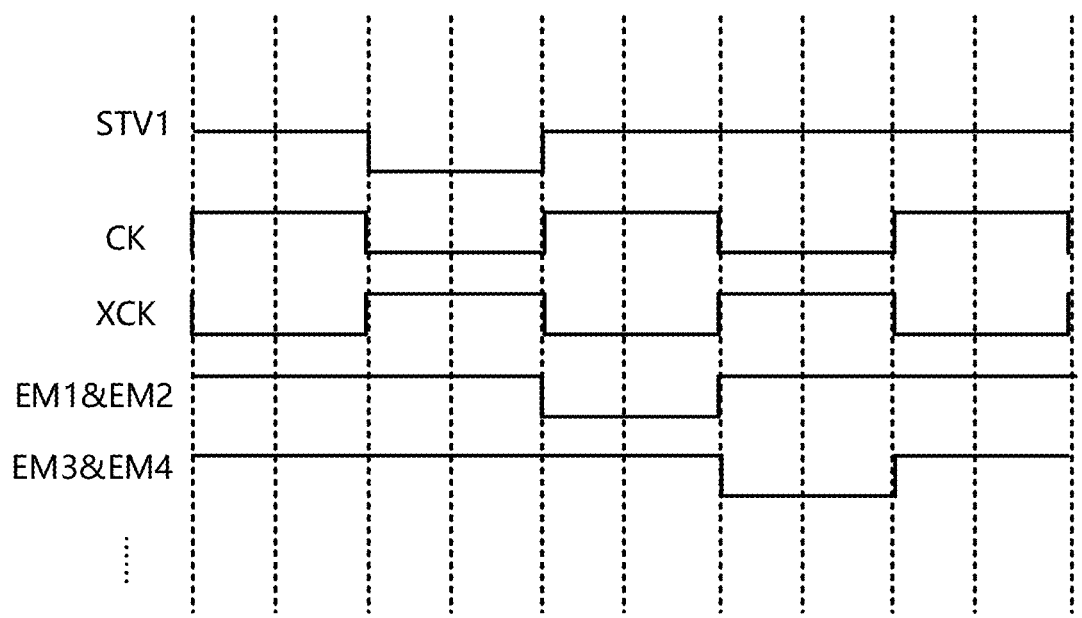
FIG. 8 shows a schematic timing diagram of a gate drive circuit in a display panel provided by another embodiment of the present application.

As shown in FIG. 8, in one frame, the gate signals EM1 and EM2 received by the first and second rows of the pixel circuits may be the same, and the gate signals EM3 and EM4 received by the third and fourth rows of the pixel circuits may be the same, the gate signals EM5 and EM6 received by the fifth and sixth rows of the pixel circuits may be the same, and the gate signals EM7 and EM8 received by seventh and eighth rows of the pixel circuits may be the same. For example, the gate signals EM1, EM3, EM5, and EM7 received by the first, third, fifth and seventh rows of the pixel circuits may be signals transmitted step by step.

Exemplarily, within one frame duration, a duration of an effective level of a gate signal generated by a gate drive circuit in the first drive mode may be shorter than a duration of an effective level of a gate signal generated by the gate drive circuit in the second drive mode. The effective level may be understood as a level that may cause the pixel circuit to turn into the light-emitting stage. For example, a low level received by the gates of the transistors T05 and T06 shown in FIG. 2 is an effective level generated by the gate drive circuit.

Figure 9:
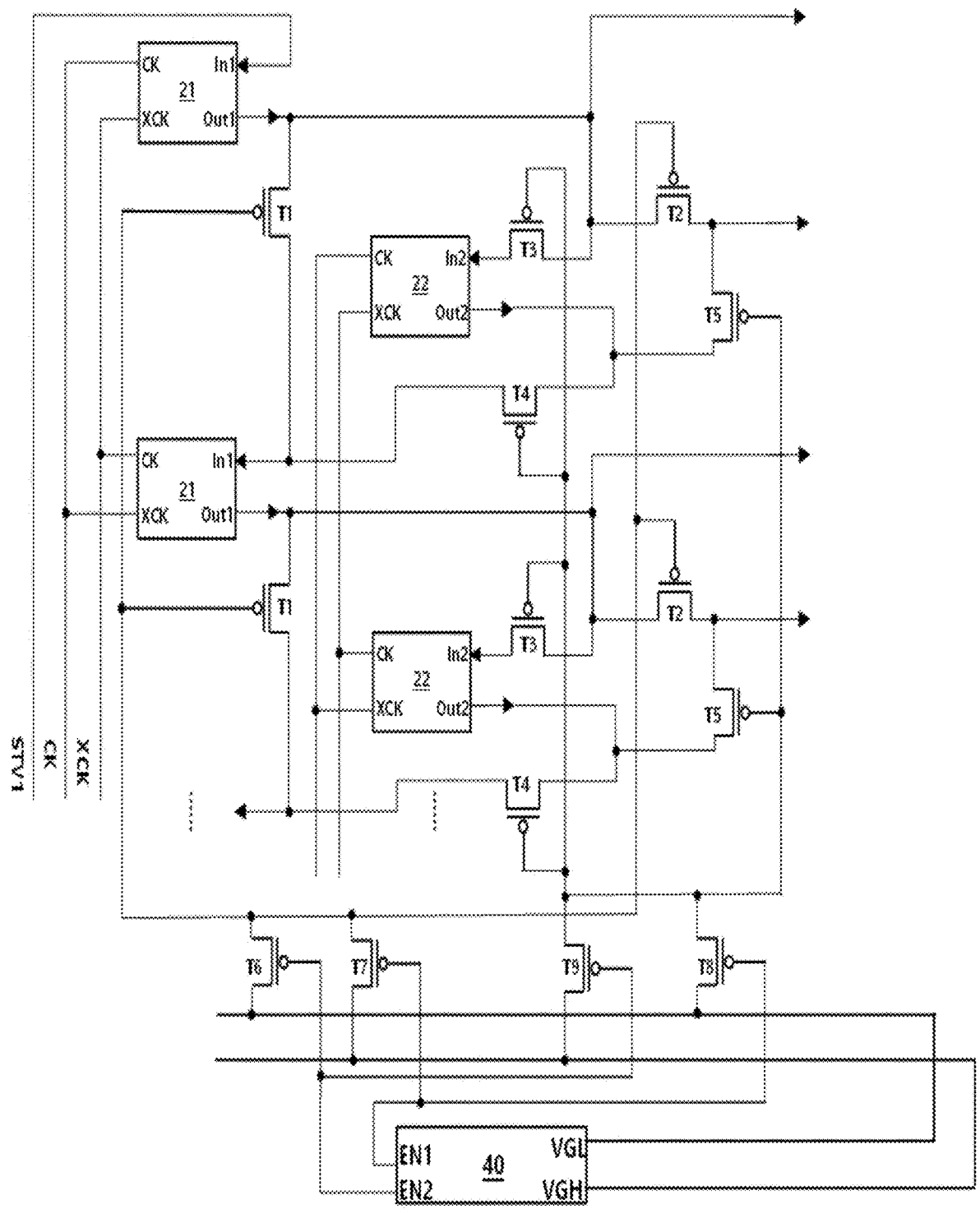
FIG. 9 shows a schematic structure diagram of a gate drive circuit in a display panel provided by yet another embodiment of the present application.

In some optional embodiments, as shown in FIG. 9, each of the control terminals of the first switches T1 and the control terminals of the second switches T2 is electrically connected to the first level signal terminal VGL via a sixth switch T6, and each of the control terminals of the first switches T1 and the control terminals of the second switches T2 is electrically connected to a second level signal terminal VGH via a seventh switch T7. The sixth switch T6 and the seventh switch T7 may be transistors, for example, the sixth switch T6 and the seventh switch T7 may be P-type transistors.

Each of the control terminals of the third switches T3, the control terminals of the fourth switches T4 and the control terminals of the fifth switches T5 is electrically connected to the first level signal terminal VGL via an eighth switch T8, and each of the control terminals of the third switches T3, the control terminals of the fourth switches T4 and the control terminals of the fifth switches T5 is electrically connected to the second level signal terminal VGH via a ninth switch T9. The eighth switch T8 and the ninth switch T9 may be transistors, for example, the eighth switch T8 and the ninth switch T9 may be P-type transistors.

Exemplarily, each of the first to ninth switches T1 to T9 may be a P-type transistor. In this way, the first to ninth switches T1 to T9 may be manufactured by using a same process.

Under a condition that the first switch T1 to the ninth switch T9 are transistors, the gates of the first switch T1 to the ninth switch T9 serve as the control terminals of the first switch T1 to the ninth switch T9 respectively.

The following takes the first switch T1 to the ninth switch T9 as P-type transistors, the first level signal terminal VGL which may provide a low level, and the second level signal terminal VGH which may provide a high level as an example, to introduce the states of the switches in different drive modes.

In the first drive mode, the sixth switch T6 may be controlled to be turned off, and the seventh switch T7 may be controlled to be turned on. The high level of the second level signal terminal VGH is transmitted to the gate of the first switch T1 and the gate of the second switch T2. The first switch T1 and the second switch T2 are turned off. The eighth switch T8 may be controlled to be turned on, and the ninth switch T9 may be controlled to be turned off. The low level of the first level signal terminal VGL is transmitted to the gate of the third switch T3, the gate of the fourth switch T4 and the gate of the fifth switch T5. The third switch T3, the fourth switch T4 and the fifth switch T5 are turned on.

In the second drive mode, the sixth switch T6 may be controlled to be turned on, and the seventh switch T7 may be controlled to be turned off. The low level of the first level signal terminal VGL is transmitted to the gate of the first switch T1 and the gate of the second switch T2. The first switch T1 and the second switch T2 are turned on. The eighth switch T8 may be controlled to be turned off, and the ninth switch T9 may be controlled to be turned on. The high level of the second level signal terminal VGH is transmitted to the gate of the third switch T3, the gate of the fourth switch T4 and the gate of the fifth switch T5. The third switch T3, the fourth switch T4 and the fifth switch T5 are turned off.

Exemplarily, a control terminal of the seventh switch T7 and a control terminal of the eighth switch T8 may be connected to a control signal terminal EN1, and a control terminal of the sixth switch T6 and a control terminal of the ninth switch T9 may be connected to a control signal terminal EN2.

Exemplarily, the display panel may further include a binding area 40, and the binding area 40 may be located in the non-display area NA. The first level signal terminal VGL, the second level signal terminal VGH, the control signal terminal EN1 and the control signal terminal EN2 may be disposed in the binding area 40. A driver chip may be bound to the signal terminals in the binding area 40, for example, the driver chip may be bound to the signal terminals in the binding area 40 through a flexible circuit board.

In some optional embodiments, a circuit structure of each of the first shift register units 21 and a circuit structure of each of the second shift register units 22 are same as each other. In this way, the design may be simplified, and a same fabrication process may be employed for the same structure thereof.

Figure 10:
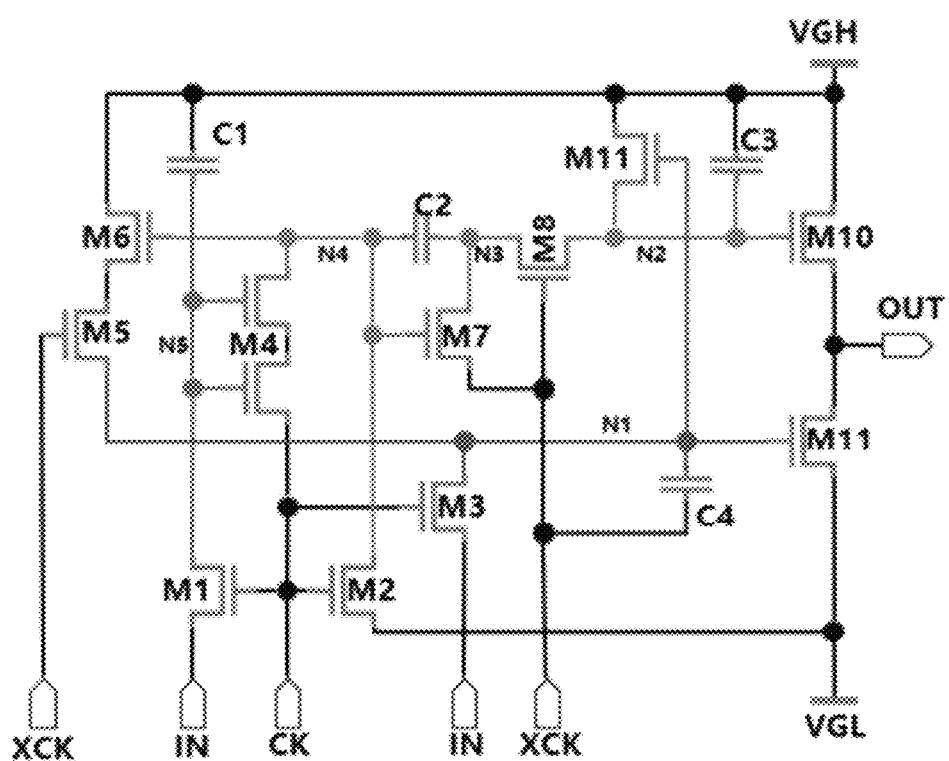
FIG. 10 shows a schematic structure diagram of a shift register unit in a display panel provided by an embodiment of the present application.

Exemplarily, as shown in FIG. 10, the first shift register unit 21 and the second shift register unit 22 may each include transistors M1-M11 and capacitors C1-C4. The connection among the transistors M1 to M11 and the capacitors C1 to C4 are shown in FIG. 10, which will not be described in detail here. N1 to N5 in FIG. 10 represent connection nodes. In case that the structure shown in FIG. 10 is the circuit structure of the first shift register unit 21, IN in FIG. 10 represents the first start signal input terminal In1, and OUT represents the first output terminal Out1. In case that the structure shown in FIG. 10 is the circuit structure of the second shift register unit 22, IN in FIG. 10 represents the second start signal input terminal In2, and OUT represents the second output terminal Out2.

FIG. 10 is only an example, and is not intended to limit the present application. The first shift register unit 21 and the second shift register unit 22 may also have circuit structures of other forms.

Figure 11:
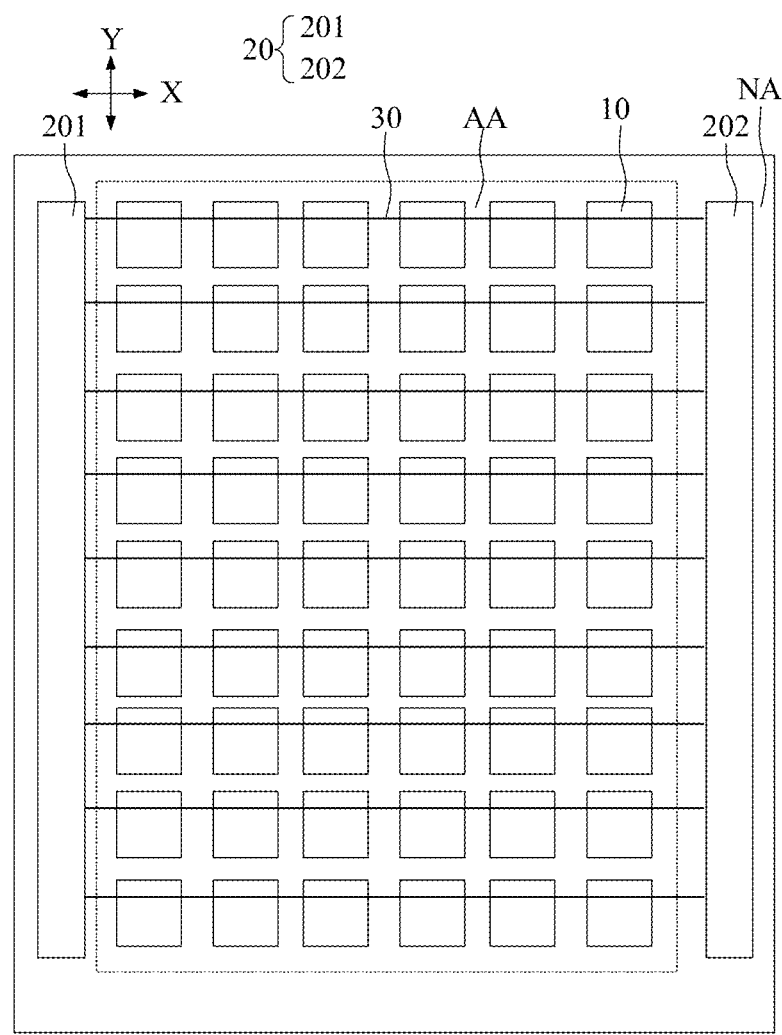
FIG. 11 shows a schematic top view of a display panel provided by another embodiment of the present application.

As another example, as shown in FIG. 11, the gate drive circuit 20 may include a first gate drive circuit 201 and a second gate drive circuit 202, and the first gate drive circuit 201 may be configured to provide gate signals to the n rows of the pixel circuits 10 simultaneously, and the second gate drive circuit 22 may be configured to provide gate signals to the m*n rows of the pixel circuits simultaneously.

Exemplarily, the first gate drive circuit 201 and the second gate drive circuit 202 may be gate drive circuits independent of each other. For example, in the first drive mode, the first gate drive circuit 201 may be controlled to be in an operating state, and the second gate drive circuit 202 may be controlled to stop operating. In the second drive mode, the first gate drive circuit 201 may be controlled to stop operating, and the second gate drive circuit 202 may be controlled to be in an operating state.

Exemplarily, when a gate circuit is in an operating state, the gate signals generated by the gate circuit may be transmitted to the pixel circuits. When the gate circuit stops operating, the gate circuit may stop generating the signals, or even if the gate circuit may generate the signals, the generated signals cannot be transmitted to the pixel circuits.

According to the embodiments of the present application, by arranging first gate drive circuit 201 and second gate drive circuit 202 independent of each other, the interference among different gate circuits can be avoided.

Exemplarily, the number of the first gate drive circuit 201 and the number of the second gate drive circuit 202 may be one or two, which is not limited in this application.

Figure 12:
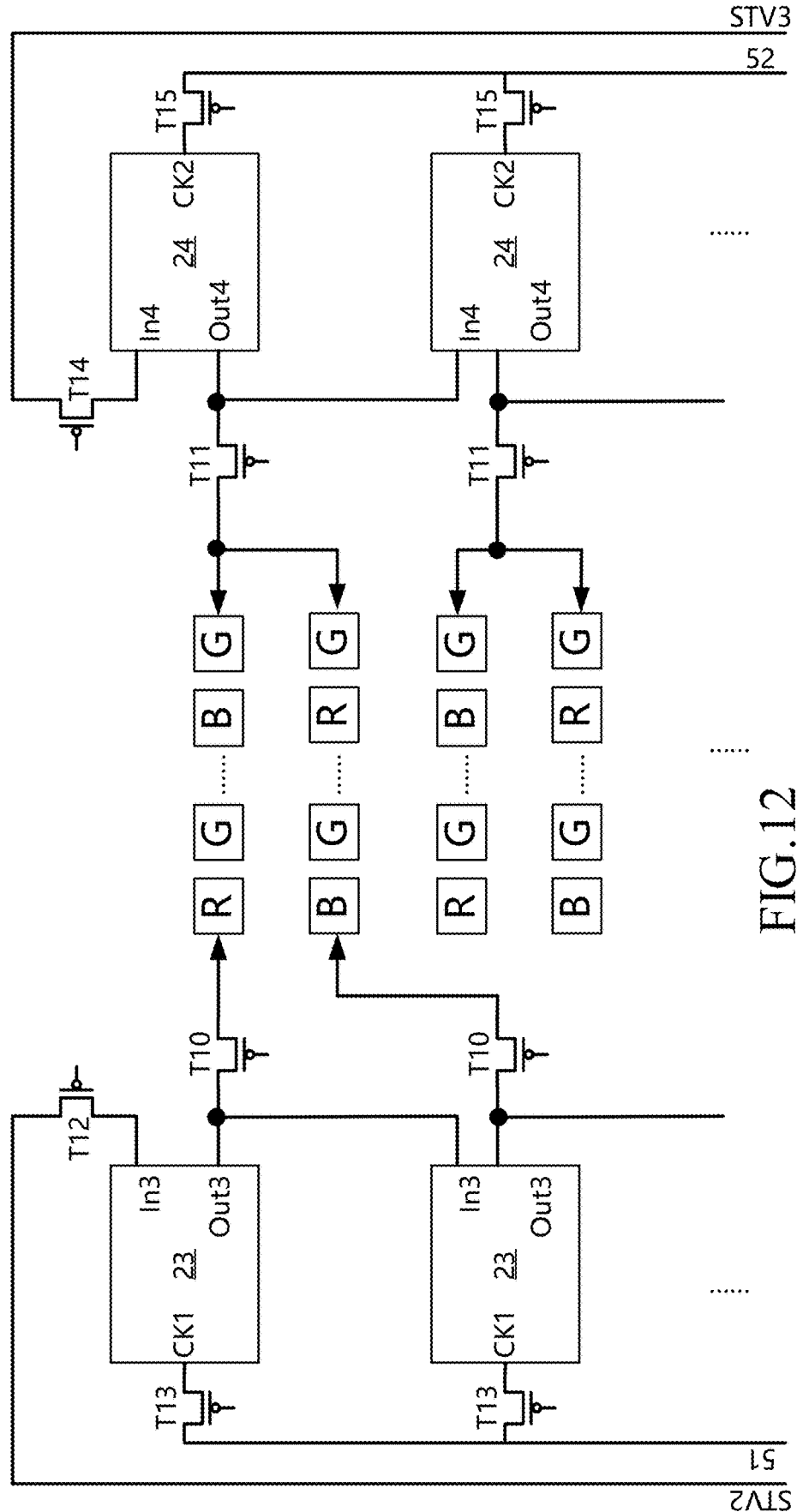
FIG. 12 and FIG. 13 show schematic structure diagrams of a gate drive circuit in a display panel provided by yet another embodiment of the present application.

In some optional embodiments, as shown in FIG. 12, the first gate drive circuit 201 may include a plurality of stages of third shift register units 23, and the second gate drive circuit 202 may include a plurality of stages of fourth shift register units 24. The third output terminals Out3 of the third shift register units 23 are electrically connected to the n rows of pixel circuits via tenth switches T10, and the fourth output terminals Out4 of fourth shift register units 24 are electrically connected to m*n rows of the pixel circuits via eleven switches T11.

In the first drive mode, the tenth switch T10 may be controlled to be turned on, and the eleventh switch T11 may be controlled to be turned off. In the second drive mode, the tenth switch T10 may be controlled to be turned off, and the eleventh switch T11 may be controlled to be turned on.

As introduced above, a pixel circuit may include a pixel circuit of an R sub-pixel, a pixel circuit of a G sub-pixel, and a pixel circuit of a B sub-pixel.

For an example, n=1, m=2, the number of third shift register units 23 may be the same as the number of the rows of pixel circuits, and the number of fourth shift register units 24 may be a half of the number of rows of pixel circuits. For another example, n=2, m=2, the number of third shift register units 23 may be a half of the number of the rows of the pixel circuits, and the number of fourth shift register units 24 may be one quarter of the number of the rows of the pixel circuits. When the half or one quarter of the number of pixel circuits is not an integer, the number of shift register units may be round up to an integer.

Exemplarily, a circuit structure of each of the third shift register units 23 and a circuit structure of each of the fourth shift register units 24 may be the same. For example, the circuit structure of each of the third shift register units 23 and the circuit structure of each of the fourth shift register unit 24 may be the structure shown in FIG. 10.

In some optional embodiments, as shown in FIG. 12, a third start signal input terminal In3 of a third shift register unit 23 of a $1^{st}$ stage may be electrically connected to the second start signal terminal STV2 via a twelfth switch T12, and clock signal input terminals CK1 of the third shift register units 23 may be electrically connected to a first clock signal terminal 51 via thirteen switches T13.

A fourth start signal input terminal In4 of a fourth shift register unit 24 of a $1^{st}$ stage is electrically connected to a third start signal terminal STV3 via a fourteenth switch T14, and clock signal input terminals CK2 of the fourth shift register units 24 are electrically connected a second clock signal terminal 52 via fifteen switches T15.

In the first drive mode, the tenth switches T10, the twelfth switch T12, and the thirteenth switches T13 may be controlled to be turned on, and the eleventh switches T11, the fourteenth switch T14, and the fifteenth switches T15 may be controlled to be turned off. In this way, each third shift register unit 23 is in an operating state, and the generated gate signals may be transmitted to respective rows of pixel circuits. Each fourth shift register unit 24 stops operating, and even if there is a signal at its output terminal, the signal at the output terminal of the fourth shift register unit 24 will not be transmitted to any row of pixel circuits, since the eleventh switches T11 are turned off.

In the second drive mode, the tenth switches T10, the twelfth switch T12, and the thirteenth switches T13 may be controlled to be turned off, and the eleventh switches T11, the fourteenth switch T14, and the fifteenth switches T15 may be controlled to be turned on. In this way, each fourth shift register unit 24 is in an operating state, and the generated gate signals may be transmitted to respective rows of pixel circuits. Each third shift register unit 23 stops operating, and even if there is a signal at its output terminal, the signal at the output terminal of the third shift register unit 23 will not be transmitted to any row of pixel circuits, since the tenth switches T10 are turned off.

Exemplarily, each of the tenth switches T10, the eleventh switches T11, the twelfth switch T12, the thirteenth switches T13, the fourteenth switch T14, and the fifteenth switches T15 may be a transistor, for example, a P-type transistor.

Figure 13:
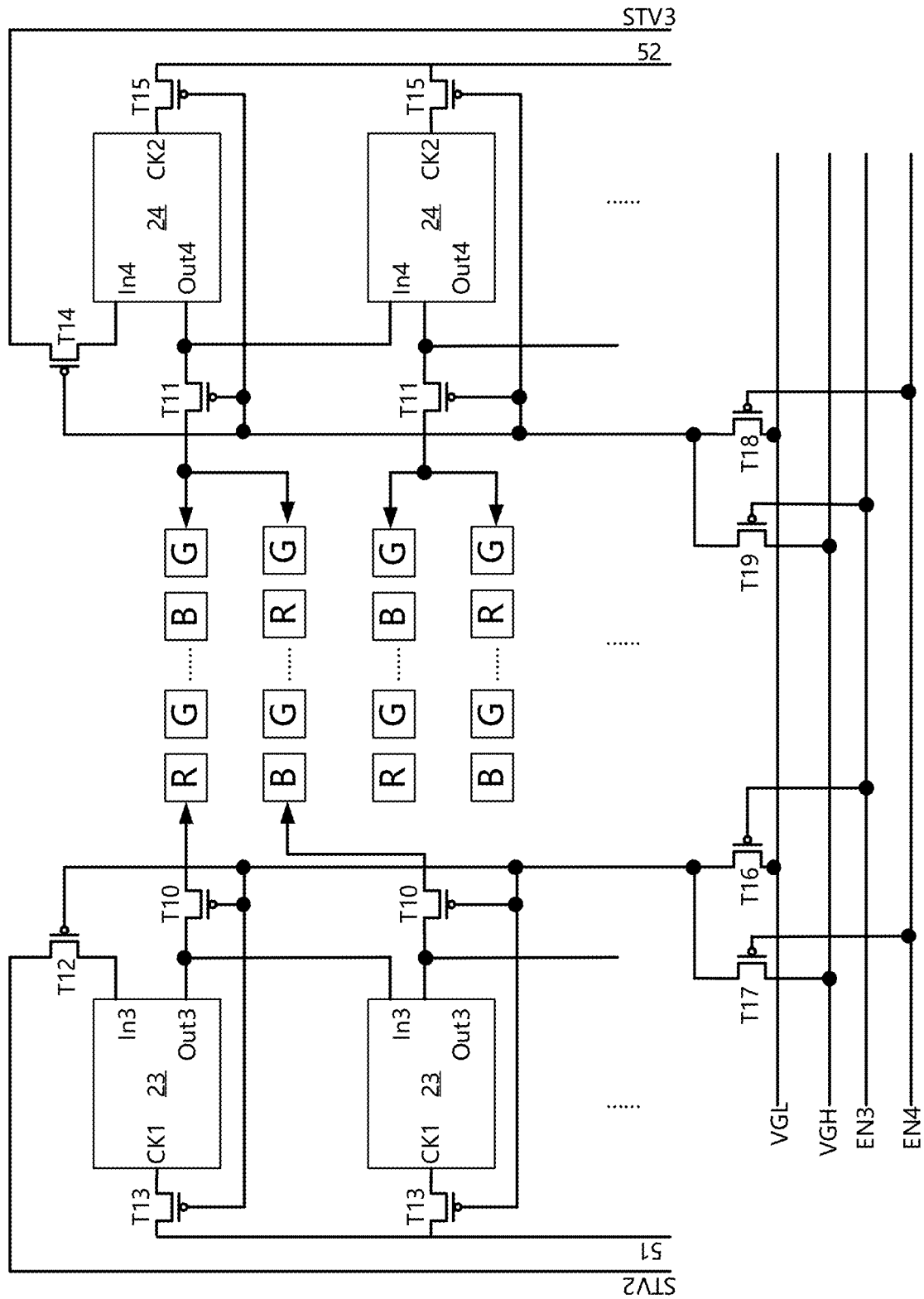

Exemplarily, as shown in FIG. 13, the control terminals of the tenth switches T10, a control terminal of the twelfth switch T12, and the control terminals of the thirteenth switches T13 may be electrically connected to the first level signal terminal VGL via a sixteenth switch T16; and the control terminals of the tenth switches T10, the control terminal of the twelfth switch T12, and the control terminals of the thirteenth switches T13 may be electrically connected to the second level signal terminal VGH via a seventeenth switch T17. The control terminals of the eleventh switches T11, a control terminal of the fourteenth switch T14, and the control terminals of the fifteenth switches T15 may be electrically connected to the first level signal terminal VGL via an eighteenth switch T18; and the control terminals of the eleventh switches T11, the control terminal of the fourteenth switch T14, and the control terminals of the fifteenth switches T15 may be electrically connected to the second level signal terminal VGH via an nineteenth switch T19.

Each of the sixteenth switch T16, the seventeenth switch T17, the eighteenth switch T18 and the nineteenth switch T19 may be a transistor, for example, a P-type transistor.

Under a condition that each of the switches is a transistor, the gate of each transistor serves as the control terminal of the switch.

The following still takes the first switch T1 to the ninth switch T9 as P-type transistors, the first level signal terminal VGL which may provide a low level, and the second level signal terminal VGH which may provide a high level as an example, to introduce the states of the switches in different drive modes.

In the first drive mode, the sixteenth switch T16 and the nineteenth switch T19 may be controlled to be turned on, and the seventeenth switch T17 and the eighteenth switch T18 may be controlled to be turned off. The low level of the first level signal terminal VGL is transmitted to the control terminals of the tenth switches T10, the control terminal of the twelfth switch T12, the control terminals of the thirteenth switches T13, and the tenth switches T10, the twelfth switch T12, and the thirteenth switches T13 are turned on. The high level of the second level signal terminal VGH is transmitted to the control terminals of the eleventh switches T11, the control terminal of the fourteenth switch T14, the control terminals of the fifteenth switches T15, and the eleventh switches T11, the fourteenth switch T14 and the fifteenth switches T15 are turned off.

In the second drive mode, the sixteenth switch T16 and the nineteenth switch T19 may be controlled to be turned off, and the seventeenth switch T17 and the eighteenth switch T18 may be controlled to be turned on. The high level of the second level signal terminal VGH is transmitted to the control terminals of the tenth switches T10, the control terminal of the twelfth switch T12, the control terminals of the thirteenth switches T13, and the tenth switches T10, the twelfth switch T12, and the thirteenth switches T13 are turned off. The low level of the first level signal terminal VGL is transmitted to the control terminals of the eleventh switches T11, the control terminal of the fourteenth switch T14, and the control terminals of the fifteenth switches T15, and the eleventh switches T11, the fourteenth switch T14 and the fifteenth switches T15 are turned on.

Exemplarily, the control terminals of the sixteenth switch T16 and the nineteenth switch T19 may be connected to a control signal terminal EN3, and the control terminals of the seventeenth switch T17 and the eighteenth switch T18 may be connected to a control signal terminal EN4.

In some optional embodiments, the second start signal terminal STV2 may be reused as the third start signal terminal STV3, and/or the first clock signal terminal 51 may be reused as the second clock signal terminal 52. Through signal terminal reusing, the number of signal terminals may be reduced and the cost may be reduced.

It should be noted that FIG. 12 only shows one clock signal input terminal CK1 of the third shift register unit 23, which does not mean that the third shift register unit 23 only includes one clock signal input terminal. The third shift register unit 23 may include a plurality of clock signal input terminals; and there may be a number of the first clock signal terminals 51, and the clock signals of the first clock signal terminals 51 may be different. Similarly, the fourth shift register unit 24 may include a plurality of clock signal input terminals; and there may be a number of the second clock signal terminals 52, and the clock signals of the second clock signal terminals 52 may also be different. For example, under a condition that the circuit structure of each of third shift register units 23 and the fourth shift register units 24 is the structure shown in FIG. 10, each of the third shift register units 23 and the fourth shift register units 24 may include two clock signal inputs.

Figure 14:
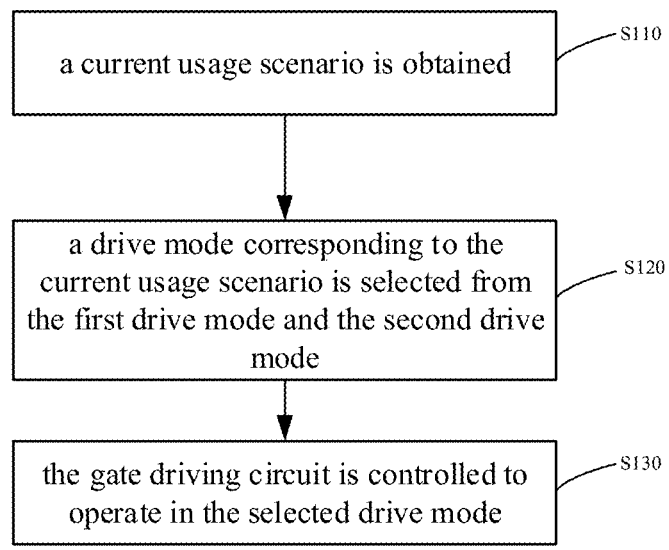
FIG. 14 shows a schematic flowchart of a display driving method for display panel provided by an embodiment of the present application.

Based on the same inventive concept, an embodiment of the present application further provides a display driving method for display panel, which may drive the display panel of any one of the foregoing embodiments. As shown in FIG. 14, the display driving method for display panel provided by the embodiment of the present application may include steps S110 to S130.

In S110, a current usage scenario is obtained.

In S120, a drive mode corresponding to the current usage scenario is selected from the first drive mode and the second drive mode.

In S130, the gate drive circuit is controlled to operate in the selected drive mode.

According to the display driving method for display panel provided by the embodiments of the present application, the gate drive circuit in the display panel may be switched between the first drive mode and the second drive mode, and thus different drive modes may be selected with respect to different application scenarios. For example, in a case that a high display image quality is required, the gate drive circuit may be switched to the first drive mode to improve the display image quality and to meet the performance index of ΔL/L; in a case that a low power consumption is required, the gate drive circuit may be switched to the second drive mode to reduce power consumption. It can be seen that the display panel provided by the embodiments of the present application may improve compatibility and adaptability, and reduce and distribute costs, thereby taking into account various and diversified demands such as cost, performance, and power consumption.

Exemplarily, the corresponding relationship among the first drive mode and the second drive mode and scenarios may be stored in a memory corresponding to the display panel in advance.

The inventor's research found that when the brightness bar of the display panel is adjusting, the user with sensitive eyes may perceive the difference in the flickering of the screen; while for displaying a static image, it is difficult for the human eyes to perceive the difference obviously, but the human may have an intuitive feeling on whether it is perfect and comfortable for the current picture quality. Further, with the help of professional optical measuring instruments, the difference in performance parameters may be easily measured, that is, when the brightness control value changes in a single step, the jump variable on the brightness change curve is smaller in the first drive mode, which means that the screen brightness transits smoothly and there is almost no flicker. In the second drive mode, with the same single step change, the brightness variability is greater (brightness jump ΔL/L), and even a brightness jump variable that may be perceived by the human eyes occurs. Therefore, the first drive mode may improve the display quality, and the second drive mode may reduce power consumption.

In some optional embodiments, the usage scenario corresponding to the first drive mode includes at least one of a scenario for adjusting a brightness bar, a scenario for a best image quality, a scenario in which a battery power is higher than a preset threshold, and a scenario for displaying video. The usage scenario corresponding to the second drive mode includes at least one of a scenario for a power saving mode, a scenario in which a battery power is lower than the preset threshold, a scenario for displaying a static image, and a scenario for an AOD screen-off display mode.

During display, the brightness bar of the display panel may be adjusted. For example, the brightness bar may be adjusted by the user manually, or the brightness bar may be adjusted by a driving system of the display panel automatically, based on the intensity of the external ambient light. The switching of the corresponding drive mode may be performed at the starting of a next frame from the adjusting of the brightness bar.

A scenario in which the battery power is higher than the preset threshold may include a scenario in which the battery power is higher than 30% or more.

The usage scenario corresponding to the first drive mode may further include a scenario for exiting the AOD off-screen display mode.

The scenario for displaying the static image may include a scenario for displaying a static picture or a web page.

In some optional embodiments, the display panel may include the plurality of stages of first shift register units and the plurality of stages of second shift register units as in the above-mentioned embodiments. Under a condition that the drive mode corresponding to the current usage scenario is the first drive mode, S130 may specifically include: controlling the first switches and the second switches to be turned off, and controlling the third switches, the fourth switches and the fifth switches to be turned on. Under a condition that the drive mode corresponding to the current usage scenario is the second drive mode, S130 may specifically include: controlling the first switches and the second switches to be turned on, and controlling the third switches, the fourth switches and the fifth switches to be turned off.

In some optional embodiments, the display panel may include the first gate drive circuit and the second gate drive circuit as in the above-mentioned embodiments. Under a condition that the drive mode corresponding to the current usage scenario is the first drive mode, S130 may specifically include: controlling the first gate drive circuit to provide gate signals to the pixel circuits, and controlling the second gate drive circuit to stop operating or controlling the second gate drive circuit to stop providing gate signals to the pixel circuits. Under a condition that the drive mode corresponding to the current usage scenario is the second drive mode, S130 may specifically include: controlling the first gate drive circuit to stop operating or controlling the first gate drive circuit to stop providing gate signals to the pixel circuits, and controlling the second gate drive circuit to provide gate signals to the pixel circuits.

Figure 15:
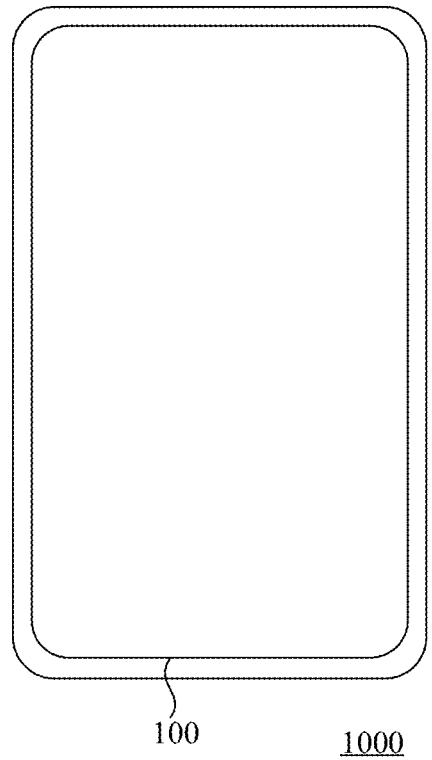
FIG. 15 shows a schematic structure diagram of a display apparatus provided by an embodiment of the present application.

Based on the same inventive concept, the present application further provides a display apparatus including the display panel provided by the present application. Please refer to FIG. 15, which is a schematic structure diagram of a display apparatus provided by an embodiment of the present application. The display apparatus 1000 provided in FIG. 15 includes the display panel 100 provided by any one of the above-mentioned embodiments of the present application. The embodiment of FIG. 15 only takes a mobile phone as an example to describe the display apparatus 1000. It may be understood that the display apparatus provided in the embodiment of the present application may be a wearable product, a computer, a TV, a vehicle-mounted display apparatus, or other display apparatus with display functions, which is not specifically limited in this application. The display apparatus provided by the embodiments of the present application has the beneficial effects of the display panel provided by the embodiments of the present application, and reference may be made to the specific descriptions of the display panel in the above-mentioned embodiments, which will not be repeated in this embodiment.

In accordance with the embodiments of the present application as described above, these embodiments do not exhaustively describe all the details, nor do they limit the application to only the specific embodiments described. Obviously, many modifications and variations are possible in light of the above description. This specification selects and specifically describes these embodiments in order to better explain the principles and practical applications of the present application, so that those skilled in the art may make good use of the present application and the modifications based on the present application. This application is to be limited only by the claims, along with their full scope and equivalents.

What is claimed is:

1. A display panel, comprising:
a plurality of rows of pixel circuits;
a gate drive circuit configured to be switched between a first drive mode and a second drive mode, wherein the first drive mode comprises that the gate drive circuit provides gate signals to n rows of the pixel circuits simultaneously, and the second drive mode comprises that the gate drive circuit provides gate signals to m*n rows of the pixel circuits simultaneously, wherein n is a positive integer, and m is an integer greater than or equal to 2, wherein m=2, and the gate drive circuit comprises a plurality of stages of first shift register units and a plurality of stages of second shift register units;

each of the first shift register units comprises a first start signal input terminal and a first output terminal, and each of the second shift register units comprises a second start signal input terminal and a second output terminal;

a first output terminal of a first shift register unit of a $i^{th}$ stage is electrically connected to a first start signal input terminal of a first shift register unit of a $(i+1)^{th}$ stage via a first switch, and the first output terminal of the first shift register unit of the $i^{th}$ stage is directly electrically connected to $(2*i*n-2*n+1)^{th}$ to $(2*i*n-n)^{th}$ rows of the pixel circuits via connecting lines, and the first output terminal of the first shift register unit of the $i^{th}$ stage is electrically connected to $(2*i*n-n+1)^{th}$ to $(2*i*n)^{th}$ rows of the pixel circuits via a second switch;

the first output terminal of the first shift register unit of the $i^{th}$ stage is electrically connected to a second start signal input terminal of a second shift register unit of a $i^{th}$ stage via a third switch;

a second output terminal of the second shift register unit of the $i^{th}$ stage is electrically connected to the first start signal input terminal of the first shift register unit of the $(i+1)^{th}$ stage via a fourth switch; and the second output terminal of the second shift register unit of the $i^{th}$ stage is electrically connected to $(2*i*n-n+1)^{th}$ to $(2*i*n)^{th}$ rows of the pixel circuits via a fifth switch, wherein i is a positive integer.

2. The display panel according to claim 1, wherein each of a control terminal of the first switch and a control terminal of the second switch is electrically connected to a first level signal terminal via a sixth switch, and each of the control terminal of the first switch and the control terminal of the second switch is electrically connected to a second level signal terminal via a seventh switch; and each of a control terminal of the third switch, a control terminal of the fourth switch and a control terminal of the fifth switch is electrically connected to the first level signal terminal via an eighth switch, and each of the control terminal of the third switch, the control terminal of the fourth switch and the control terminal of the fifth switch is electrically connected to the second level signal terminal via a ninth switch.

3. The display panel according to claim 2, wherein the first to ninth switches comprise P-type transistors.

4. The display panel according to claim 1, wherein a first start signal input terminal of a first shift register unit of a $1^{st}$ stage is electrically connected to a first start signal terminal; and the first shift register units and the second shift register units are connected to a same clock signal terminal.

5. The display panel according to claim 1, wherein n=1.

6. The display panel according to claim 1, wherein a circuit structure of each of the first shift register units and a circuit structure of each of the second shift register units are same as each other.

7. A display driving method for a display panel, wherein the display panel comprises the display panel according to claim 1, and the method comprises:
obtaining a current usage scenario;

selecting a drive mode corresponding to the current usage scenario from the first drive mode and the second drive mode; and controlling the gate drive circuit to operate in the selected drive mode.

8. The display driving method according to claim 7, wherein a usage scenario corresponding to the first drive mode comprises at least one of a scenario for adjusting a brightness bar, a scenario for a best image quality, a scenario in which a battery power is higher than a preset threshold, and a scenario for displaying video; and a usage scenario corresponding to the second drive mode comprises at least one of a scenario for a power saving mode, a scenario in which a battery power is lower than the preset threshold, a scenario for displaying a static image, and a scenario for a AOD screen-off display mode.

9. The display driving method according to claim 7, wherein under a condition that the drive mode corresponding to the current usage scenario is the first drive mode, controlling the gate drive circuit to operate in the selected drive mode comprises:

controlling the first switch and the second switch to be turned off, and controlling the third switch, the fourth switch and the fifth switch to be turned on; and under a condition that the drive mode corresponding to the current usage scenario is the second drive mode, controlling the gate drive circuit to operate in the selected drive mode comprises:

controlling the first switch and the second switch to be turned on, and controlling the third switch, the fourth switch and the fifth switch to be turned off.

10. A display apparatus comprising the display panel according to of claim 1.

* * * * *